(12) United States Patent
Moon

(10) Patent No.: US 12,242,189 B2
(45) Date of Patent: *Mar. 4, 2025

(54) SEMICONDUCTOR PHOTORESIST COMPOSITION, METHOD FOR PREPARING THEREOF AND METHOD OF FORMING PATTERNS USING THE COMPOSITION

(71) Applicant: Samsung SDI Co., Ltd., Yongin-si (KR)

(72) Inventor: Kyungsoo Moon, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 214 days.

This patent is subject to a terminal disclaimer.

(21) Appl. No.: 17/454,447

(22) Filed: Nov. 10, 2021

(65) Prior Publication Data

US 2022/0194968 A1 Jun. 23, 2022

(30) Foreign Application Priority Data

Dec. 18, 2020 (KR) ........................ 10-2020-0178616

(51) Int. Cl.
| | | |
|---|---|---|
| *G03F 7/004* | (2006.01) | |
| *C07F 7/22* | (2006.01) | |
| *G03F 7/20* | (2006.01) | |
| *G03F 7/40* | (2006.01) | |

(52) U.S. Cl.
CPC .......... *G03F 7/0042* (2013.01); *C07F 7/2224* (2013.01); *G03F 7/2004* (2013.01); *G03F 7/40* (2013.01)

(58) Field of Classification Search
CPC ......... G03F 7/0042; G03F 7/40; C07F 7/2224
See application file for complete search history.

(56) References Cited

U.S. PATENT DOCUMENTS

| | | | |
|---|---|---|---|
| 2,826,597 | A | 3/1958 | Gloskey |
| 2,832,751 | A | 4/1958 | Weinberg et al. |
| 5,061,599 | A | 10/1991 | Kudo et al. |
| 6,103,448 | A | 8/2000 | Kim et al. |
| 6,514,666 | B1 | 2/2003 | Choi et al. |
| 6,607,867 | B1 | 8/2003 | Kim et al. |
| 11,609,494 | B2 * | 3/2023 | Kim .................... H01L 21/3081 |
| 2002/0072009 | A1 | 6/2002 | Kim et al. |
| 2011/0045406 | A1 | 2/2011 | Keszler et al. |
| 2011/0293888 | A1 | 12/2011 | Stowers et al. |
| 2012/0208127 | A1 | 8/2012 | Hatakeyama |
| 2013/0005150 | A1 | 1/2013 | Ogihara et al. |
| 2013/0224652 | A1 | 8/2013 | Bass et al. |
| 2015/0056542 | A1 * | 2/2015 | Meyers ..................... G03F 7/30 430/296 |
| 2016/0116839 | A1 | 4/2016 | Meyers et al. |
| 2016/0310944 | A1 | 10/2016 | Nishimura et al. |
| 2017/0009062 | A1 | 1/2017 | Kimura et al. |
| 2017/0052449 | A1 | 2/2017 | Nakagawa et al. |
| 2017/0102612 | A1 | 4/2017 | Meyers et al. |
| 2018/0046086 | A1 | 2/2018 | Waller et al. |
| 2019/0033713 | A1 | 1/2019 | Kasahara et al. |
| 2019/0153001 | A1 | 5/2019 | Cardineau et al. |
| 2019/0227432 | A1 | 7/2019 | Shiratani |
| 2019/0243243 | A1 | 8/2019 | Naito et al. |
| 2019/0337969 | A1 | 11/2019 | Odedra et al. |
| 2019/0384171 | A1 | 12/2019 | Zi et al. |
| 2020/0041896 | A1 | 2/2020 | Moon et al. |
| 2020/0041897 | A1 | 2/2020 | Moon et al. |
| 2020/0041901 | A1 | 2/2020 | Namgung et al. |
| 2020/0073238 | A1 | 3/2020 | Zi et al. |
| 2020/0117085 | A1 | 4/2020 | Moon et al. |

(Continued)

FOREIGN PATENT DOCUMENTS

| | | |
|---|---|---|
| CN | 102269929 A | 12/2011 |
| CN | 108351594 A | 7/2018 |

(Continued)

OTHER PUBLICATIONS

Christopher N. Anderson, et al., "The SEMATECH Berkeley MET: extending EUV learning down to 16nm half pitch", Proceedings of SPIE, 2011, pp. 79690R-1 to 79690R-6, vol. 7969, SPIE, San Jose, California. Downloaded from: https://www.spiedigitallibrary.org/conference-proceedings-of-spie on Aug. 16, 2018.

(Continued)

*Primary Examiner* — John S. Chu

(74) *Attorney, Agent, or Firm* — Womble Bond Dickinson (US) LLP

(57) ABSTRACT

A semiconductor photoresist composition includes an organotin compound represented by Chemical Formula 1, and a solvent. A method for preparing the same, and a method of forming patterns utilizing the same are disclosed.

Chemical Formula 1

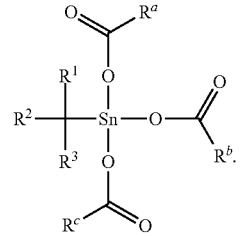

Specific details of Chemical Formula 1 are as defined in the specification.

18 Claims, 3 Drawing Sheets

(56) References Cited

U.S. PATENT DOCUMENTS

| | | | |
|---|---|---|---|
| 2020/0326627 | A1 | 10/2020 | Jiang et al. |
| 2020/0348591 | A1* | 11/2020 | Kim .................... H01L 21/3081 |
| 2021/0311387 | A1 | 10/2021 | Woo et al. |
| 2021/0356861 | A1 | 11/2021 | Han et al. |
| 2022/0197138 | A1* | 6/2022 | Moon .................. C07F 7/2224 |

FOREIGN PATENT DOCUMENTS

| | | |
|---|---|---|
| CN | 110780536 A | 2/2020 |
| CN | 111856879 A | 10/2020 |
| CN | 113655689 A | 11/2021 |
| JP | 8-260159 A | 10/1996 |
| JP | 3990146 B2 | 10/2007 |
| JP | 2009-229593 A | 10/2009 |
| JP | 4831324 B2 | 12/2011 |
| JP | 5178858 B2 | 4/2013 |
| JP | 5650086 B2 | 1/2015 |
| JP | 5708521 B2 | 4/2015 |
| JP | 2017-207532 A | 11/2017 |
| JP | 2018-502173 A | 1/2018 |
| JP | 2018-017780 A | 2/2018 |
| JP | 2018-041099 A | 3/2018 |
| JP | 2019-500490 A | 1/2019 |
| JP | 2019-183150 A | 10/2019 |
| JP | 2019-532489 A | 11/2019 |
| JP | 2020-21071 A | 2/2020 |
| JP | 2020-530199 A | 10/2020 |
| JP | 2020-184074 A | 11/2020 |
| KR | 1995-0001702 B1 | 2/1995 |
| KR | 10-0269513 B1 | 10/2000 |
| KR | 2002-0041759 A | 6/2002 |
| KR | 10-0398312 B1 | 9/2003 |
| KR | 10-0386719 B1 | 5/2004 |
| KR | 10-2014-0121826 A | 10/2014 |
| KR | 10-1486533 B1 | 2/2015 |
| KR | 10-2017-0022945 A | 3/2017 |
| KR | 10-2017-0132726 A | 12/2017 |
| KR | 10-2018-0043170 A | 4/2018 |
| KR | 10-2019-0045162 A | 5/2019 |
| KR | 10-2019-0082279 A | 7/2019 |
| KR | 10-2020-0005370 A | 1/2020 |
| KR | 10-2020-0014043 A | 2/2020 |
| KR | 10-2020-0014185 A | 2/2020 |
| KR | 10-2020-0014216 A | 2/2020 |
| KR | 10-2020-0018080 A | 2/2020 |
| KR | 10-2021-0094420 A | 7/2021 |
| KR | 10-2021-0123138 A | 10/2021 |
| KR | 10-2021-0138416 A | 11/2021 |
| TW | 201920214 A | 6/2019 |
| TW | 201924927 A | 7/2019 |
| TW | I669353 B | 8/2019 |
| TW | 202007691 A | 2/2020 |
| TW | I684063 B | 2/2020 |
| TW | 202041513 A | 11/2020 |
| WO | WO 2016/140057 A1 | 9/2016 |
| WO | WO 2017/169440 A1 | 10/2017 |
| WO | WO 2018/043506 A1 | 3/2018 |
| WO | WO 2018/046438 A1 | 3/2018 |
| WO | WO 2018/168221 A1 | 9/2018 |
| WO | WO 2018/179704 A1 | 10/2018 |

OTHER PUBLICATIONS

Hiroshi Okamoto, et al., "Peroxypolytungstic acids: A new inorganic resist material", Applied Physics Letters, Aug. 4, 1986, pp. 298-300, vol. 49, No. 5, American Institute of Physics.

Jason K. Stowers, et al., "Directly patterned inorganic hardmask for EUV lithography", Proceedings of SPIE, 2011, pp. 796915-1 to 796915-11, vol. 7969, SPIE, San Jose, California. Downloaded from: https://www.spiedigitallibrary.org/conference-proceedings-of-spie on Aug. 16, 2018.

Japanese Office Action dated Nov. 29, 2022, for corresponding Japanese Patent Application No. 2021-183254 (2 pp.).

Abstract of corresponding document US2018046086 (A1) for JP 2019-532489 A (2 pp.).

Abstract of corresponding document CA2975104 (A1) for JP 2020-530199 A (1 pp.).

Taiwanese Search Report dated Jul. 6, 2022, for Application No. 110144655, 2 pages.

JPO Office action dated May 25, 2021 issued in Japanese Application No. 2020-080534, 4 pages.

Japanese Notice of Reason for Rejection for JP Application No. 2021-078454 dated Jun. 7, 2022, 3 pages.

Japanese Office Action for JP Application No. 2021-056503 dated Mar. 29, 2022, 3 pages.

Japanese Notice of Reasons for Rejection dated Nov. 15, 2022 issued in JP Application No. 2021-183873 (3 pages).

Japanese Notice of Allowance dated Nov. 14, 2023, issued in Japanese Patent Application No. 2021-183254 (3 pages).

Korean Office Action dated May 12, 2023, issued in Korean Patent Application No. 10-2020-0040507 (7 pages).

Korean Office Action dated May 12, 2023, issued in Korean Patent Application No. 10-2020-0056720 (7 pages).

Korean Office Action dated Oct. 23, 2023, issued in Korean Patent Application No. 10-2020-0178616 (5 pages).

Korean Notice of Allowance dated Oct. 23, 2023, issued in Korean Patent Application No. 10-2020-0178620 (3 pages).

Taiwanese Office Action dated Nov. 8, 2021, in Taiwanese Patent Application No. 109114182 and accompanying Search Report (6 pages).

TW Office Action and Search Report dated Nov. 16, 2021 in Taiwanese Patent Application No. 110116951, 7 pages.

Taiwanese Office Action for TW Application No. 110111615 dated Apr. 29, 2022, 5 pages.

Taiwanese Search Report dated Jun. 25, 2022, for Application No. 110143319, 2 pages.

US Notice of Allowance dated Jul. 29, 2022, issued in U.S. Appl. No. 16/859,682 (7 pages).

US Notice of Allowance dated Nov. 9, 2022, issued in U.S. Appl. No. 16/859,682 (7 pages).

US Restriction Requirement dated Jan. 3, 2023, issued in U.S. Appl. No. 17/306,820 (6 pages).

US Office Action dated May 10, 2023, issued in U.S. Appl. No. 17/306,820 (8 pages).

US Non-Final Rejection issued in U.S. Appl. No. 16/859,682, dated Dec. 20, 2021, 12 pages.

US Notice of Allowance dated Apr. 13, 2022, issued in U.S. Appl. No. 16/859,682, 8 pages.

US Office Action dated Mar. 24, 2023, issued in U.S. Appl. No. 17/454,453 (17 pages).

US Office Action dated Sep. 27, 2023, issued in U.S. Appl. No. 17/454,453 (9 pages).

Chinese Office Action dated Apr. 20, 2024, issued in Chinese Patent Application No. 202111360348.8 (5 pages).

* cited by examiner

SEMICONDUCTOR PHOTORESIST COMPOSITION, METHOD FOR PREPARING THEREOF AND METHOD OF FORMING PATTERNS USING THE COMPOSITION

CROSS-REFERENCE TO RELATED APPLICATION

This application claims priority to and the benefit of Korean Patent Application No. 10-2020-0178616, filed in the Korean Intellectual Property Office on Dec. 18, 2020, the entire content of which is incorporated herein by reference.

BACKGROUND

1. Field

The following disclosure relates to a semiconductor photoresist composition, a method for preparing the same, and a method of forming patterns utilizing the composition.

2. Description of the Related Art

Extreme ultraviolet (EUV) lithography is regarded as one important (e.g., essential) technology for manufacturing next generation semiconductor devices. The EUV lithography is a pattern-forming technology utilizing an EUV ray having a wavelength of 13.5 nm as an exposure light source. Utilizing EUV lithography, an extremely fine pattern (e.g., less than or equal to 20 nm, e.g., in half-pitch, pitch, length, or width) may be formed in an exposure process during the manufacturing of a semiconductor device.

Extreme ultraviolet (EUV) lithography may be realized through development of compatible photoresists which can be performed at (e.g., applied with) a spatial resolution of less than or equal to 16 nm. Currently, efforts are being made to overcome insufficient (e.g., failure to meet) specifications of related art chemically amplified (CA) photoresists, such as resolution, photospeed, and/or feature roughness (also referred to as a line edge roughness or LER), for next generation devices.

An intrinsic image blurring due to an acid catalyzed reaction in polymer-type photoresists (e.g., polymer based photoresists) limits the resolution in small feature sizes, which has been well known in electron beam (e-beam) lithography for a long time. The chemically amplified (CA) photoresists are designed for high sensitivity, but because their typical composition (e.g., elemental makeups) may reduce light absorbance of the photoresists at a wavelength of 13.5 nm and thus, the chemically amplified (CA) photoresists may have decreased sensitivity, and may at least partially, have more difficulties under EUV exposure.

In addition, the CA photoresists may have difficulties in (e.g., producing) the small feature sizes due to roughness issues, and line edge roughness (LER) of the CA photoresists have been found to increase (e.g., experimentally turns out to be increased), as a photospeed is decreased partially due to an essence of acid catalyzed processes. Accordingly, a novel high performance photoresist is desired in the semiconductor industry because of these defects and problems of the CA photoresists.

In order to overcome the aforementioned drawbacks of the chemically amplified (CA) organic photosensitive composition, an inorganic photosensitive composition has been researched. The inorganic photosensitive composition is mainly utilized for negative tone patterning, having resistance against removal by a developer composition due to chemical modification through a nonchemical amplification mechanism. The inorganic composition contains an inorganic element having a higher EUV absorption rate than a hydrocarbon and thus may secure sensitivity through the nonchemical amplification mechanism and in addition, is less sensitive to a stochastic effect and thus is suitable to have low line edge roughness and small number of defects.

Inorganic photoresists based on peroxopolyacids of tungsten mixed with tungsten, niobium, titanium, and/or tantalum have been reported as radiation sensitive materials for patterning (for example, in U.S. Pat. No. 5,061,599 and H. Okamoto, T. Iwayanagi, K. Mochiji, H. Umezaki, T. Kudo, Applied Physics Letters, 49 5, 298-300, 1986, the entire contents of both of which are incorporated herein by reference).

These materials are effective for patterning large pitches for a bilayer configuration utilizing far ultraviolet (deep UV), X-ray, and/or electron beam sources. More recently, when cationic hafnium metal oxide sulfate (HfSOx) materials along with a peroxo complexing agent has been utilized to image a 15 nm half-pitch (HP) through projection EUV exposure, impressive performance has been obtained (US 2011-0045406 and J. K. Stowers, A. Telecky, M. Kocsis, B. L. Clark, D. A. Keszler, A. Grenville, C. N. Anderson, P. P. Naulleau, Proc. SPIE, 7969, 796915, 2011, the entire contents of both of which are incorporated herein by reference). This system exhibits suitable (e.g., the highest) performance of a non-CA photoresist and has a practicable photospeed close to that required for an EUV photoresist. However, the hafnium metal oxide sulfate materials having the peroxo complexing agent have a few practical drawbacks. First, these materials are coated in a mixture of corrosive sulfuric acid/hydrogen peroxide and have insufficient shelf-life stability. Second, a structural modification thereof for performance improvement as a composite mixture is not easy. Third, development is performed in a TMAH (tetramethylammonium hydroxide) solution at an extremely high concentration of 25 wt %, and/or the like.

SUMMARY

One or more aspects of embodiments of the present disclosure are directed toward a semiconductor photoresist composition having suitable (e.g., excellent) sensitivity, resolution, and storage stability, and a method for preparing the same.

One or more aspects of embodiments of the present disclosure are directed toward a pattern forming method utilizing the semiconductor photoresist composition.

According to an embodiment of the present disclosure, a semiconductor photoresist composition according to an embodiment includes an organotin compound represented by Chemical Formula 1, and a solvent.

Chemical Formula 1

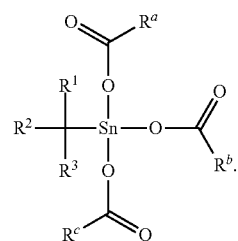

In Chemical Formula 1,

R¹ to R³ are each independently a substituted or unsubstituted C1 to C20 alkyl group, and $R^a$, $R^b$, and $R^c$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group.

R¹ to R³ of Chemical Formula 1 may each independently be a methyl group, an ethyl group, an n-propyl group, an iso-propyl group, an n-butyl group, an iso-butyl group, a sec-butyl group, or a t-butyl group.

$R^a$, $R^b$, and $R^c$ of Chemical Formula 1 may each independently be a methyl group, an ethyl group, an n-propyl group, an iso-propyl group, an n-butyl group, an iso-butyl group, a sec-butyl group, or a t-butyl group.

The semiconductor photoresist composition may further include an additive selected from a surfactant, a crosslinking agent, a leveling agent, and combinations thereof.

According to another embodiment, a method for preparing the composition for a semiconductor photoresist includes reacting an organotin compound represented by Chemical Formula 2 with an organic compound represented by Chemical Formula 3 in an organic solvent to prepare the organotin compound represented by Chemical Formula 1, and mixing the prepared organotin compound with the solvent.

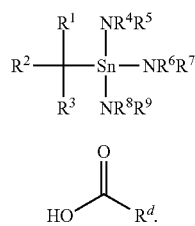

Chemical Formula 2

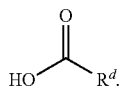

Chemical Formula 3

In Chemical Formula 2 and Chemical Formula 3,

R¹ to R³ are each independently a substituted or unsubstituted C1 to C20 alkyl group, R⁴ to R⁹ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group, and $R^d$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group;

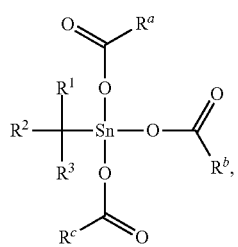

Chemical Formula 1 and wherein, in Chemical Formula 1,

R¹ to R³ are each independently a substituted or unsubstituted C1 to C20 alkyl group, and $R^a$, $R^b$, and $R^c$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group.

The reacting of the organotin compound represented by Chemical Formula 2 with the organic compound represented by Chemical Formula 3 in the organic solvent to prepare the organotin compound represented by Chemical Formula 1 may include: dissolving the organotin compound represented by Chemical Formula 2 in the organic solvent, adding the organic compound represented by Chemical Formula 3 thereto dropwise at about −78° C. to about 60° C., and reacting for about 2 hours to about 24 hours to prepare the organotin compound represented by Chemical Formula 1.

R¹ to R³ of Chemical Formulas 1 and 2 may each independently be a methyl group, an ethyl group, an n-propyl group, an iso-propyl group, an n-butyl group, an iso-butyl group, a sec-butyl group, or a t-butyl group.

R⁴ to R⁹ of Chemical Formula 2 may each independently be a substituted or unsubstituted C1 to C10 alkyl group, a substituted or unsubstituted C2 to C8 alkenyl group, or a substituted or unsubstituted C2 to C8 alkynyl group.

$R^d$ of Chemical Formula 3 may be hydrogen, a methyl group, an ethyl group, an n-propyl group, an iso-propyl group, an n-butyl group, an iso-butyl group, a sec-butyl group, or a t-butyl group.

The method for preparing the semiconductor photoresist composition may further include mixing with an additive selected from a surfactant, a crosslinking agent, a leveling agent, and combinations thereof.

A method of forming patterns according to another embodiment includes forming an etching-objective layer on a substrate, coating the semiconductor photoresist composition on the etching-objective layer to form a photoresist layer, patterning the photoresist layer to form a photoresist pattern, and etching the etching-objective layer utilizing the photoresist pattern as an etching mask.

The patterning of the photoresist layer to form the photoresist pattern may include exposing the photoresist layer to light with a wavelength of about 5 nm to about 150 nm.

The patterning of the photoresist layer to form the photoresist pattern may further include providing a resist underlayer between the substrate and the photoresist layer.

The photoresist pattern may have a width of about 5 nm to about 100 nm.

The semiconductor photoresist composition according to an embodiment has excellent sensitivity, resolution, and storage stability, and by utilizing it, it is possible to provide a photoresist pattern in which the pattern does not collapse even though it has a high aspect ratio.

DETAILED DESCRIPTION

Figure 1:
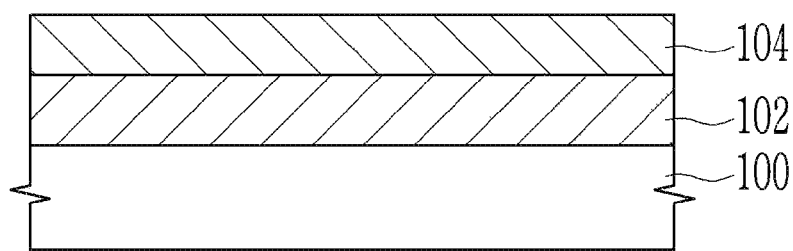
FIGS. 1-5 are cross-sectional views for explaining a method of forming patterns utilizing a semiconductor photoresist composition according to an embodiment.

Hereinafter, referring to the drawings, embodiments of the present disclosure are described in more detail. In the following description of the present disclosure, well-known functions or constructions will not be described in order to clarify (e.g., focus on) the subject matter of the present disclosure.

In order to clearly illustrate the subject matter of the present disclosure, throughout the disclosure, the same or similar configuration elements are designated by the same reference numerals. Also, because the size and thickness of each configuration shown in the drawing are arbitrarily shown for better understanding and ease of description, the present disclosure is not necessarily limited thereto.

In the drawings, the thicknesses of layers, films, panels, regions, etc., may be exaggerated for clarity. In the drawings, the thickness of a part of a layer, a region, etc., may be exaggerated for clarity. It will be understood that when an element such as a layer, film, region, or substrate is referred to as being "on" another element, it can be directly on the other element or intervening elements may also be present.

As used herein, the term "substituted" refers to replacement of a hydrogen atom by deuterium, a halogen atom, a hydroxy group, an amino group, a substituted or unsubstituted C1 to C30 amine group, a nitro group, a substituted or unsubstituted C1 to C40 silyl group, a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, or a cyano group. The term "unsubstituted" as used herein refers to non-replacement of any hydrogen atom by another substituent (e.g., none of the hydrogen atoms are replaced by another substituent).

As used herein, when a definition is not otherwise provided, the term "an alkyl group" refers to a linear or branched aliphatic hydrocarbon group. The alkyl group may be "a saturated alkyl group" without any double bond or triple bond.

The alkyl group may be a C1 to C20 alkyl group. For example, the alkyl group may be a C1 to C10 alkyl group or a C1 to C6 alkyl group. For example, the term "C1 to C4 alkyl group" refers to that the alkyl chain contains 1 to 4 carbon atoms, and may be selected from a methyl group, an ethyl group, a propyl group, an iso-propyl group, an n-butyl group, an iso-butyl group, a sec-butyl, and a t-butyl group.

Examples of the alkyl group may include a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and/or the like.

As used herein, when a definition is not otherwise provided, the term "cycloalkyl group" refers to a monovalent cyclic aliphatic hydrocarbon group.

As used herein, when a definition is not otherwise provided, the term "alkenyl group" refers to an aliphatic unsaturated alkenyl group including at least one double bond as a linear or branched aliphatic hydrocarbon group.

As used herein, when a definition is not otherwise provided, the term "alkynyl group" refers to an aliphatic unsaturated alkynyl group including at least one triple bond as a linear or branched aliphatic hydrocarbon group.

As used herein, the term "aryl group" refers to a substituent in which all atoms in the cyclic substituent have a p-orbital and these p-orbitals are conjugated and may include a monocyclic or fused ring polycyclic functional group (i.e., rings sharing adjacent pairs of carbon atoms).

Hereinafter, a semiconductor photoresist composition according to an embodiment is described.

The semiconductor photoresist composition according to an embodiment of the present disclosure includes an organotin compound, and a solvent, wherein the organotin compound is represented by Chemical Formula 1.

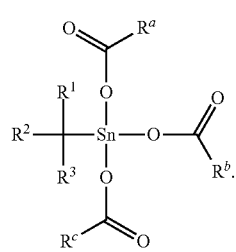

Chemical Formula 1

In Chemical Formula 1, $R^1$ to $R^3$ are each independently a substituted or unsubstituted C1 to C20 alkyl group, $R^a$, $R^b$, and $R^c$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group; or combinations thereof.

The organotin compound included in the semiconductor photoresist composition according to an embodiment of the present disclosure includes a C1 to C20 alkyl group, and $R^1$ to $R^3$ of Chemical Formula 1 are concurrently or simultaneously a substituted or unsubstituted C1 to C20 alkyl group. In this case, the organotin compound is stable by itself, and penetration of external moisture may be reduced.

Accordingly, the organotin compound exhibits suitable (e.g., excellent) storage stability even in reactive solvents, especially solvents with high water reactivity, for example, alcohol-based, ester-based, and/or ketone-based solvents, and furthermore, may maintain suitable (e.g., excellent) storage stability in solvents containing more water in these solvents (e.g., in mixtures of these solvents with water).

Therefore, the storage stability of the semiconductor photoresist composition including the organotin compound represented by Chemical Formula 1 may be improved.

In addition, when $R^1$ to $R^3$ in Chemical Formula 1 are concurrently or simultaneously substituted or unsubstituted C1 to C20 alkyl groups, the dissociation energy of the bond between tin and carbon of the alkyl group is low, so that the sensitivity to exposure may be increased.

Accordingly, a pattern may be formed even by exposure with low energy, and thus, the sensitivity of the semiconductor photoresist composition including the organotin compound represented by Chemical Formula 1 may be improved.

In some embodiments, $R^1$ to $R^3$ in Chemical Formula 1 may each independently be a substituted or unsubstituted C1 to C10 alkyl group.

For example, $R^1$ to $R^3$ in Chemical Formula 1 may each independently be (e.g., at least one) selected from a methyl group, an ethyl group, an n-propyl group, an iso-propyl group, an n-butyl group, an iso-butyl group, a sec-butyl group, and a t-butyl group.

For example, $R^1$ to $R^3$ in Chemical Formula 1 may be the same as or different from one another.

In some embodiments, in Chemical Formula 1, $R^a$, $R^b$, and $R^c$ may each independently be (e.g., at least one) selected from a substituted or unsubstituted C1 to C10 alkyl group, a substituted or unsubstituted C2 to C8 alkenyl group, and a substituted or unsubstituted C2 to C8 alkynyl group.

For example, $R^a$, $R^b$, and $R^c$ in Chemical Formula 1 may each independently be (e.g., at least one) selected from a methyl group, an ethyl group, an n-propyl group, an iso-propyl group, an n-butyl group, an iso-butyl group, a sec-butyl group, and a t-butyl group.

For example, $R^a$, $R^b$, and $R^c$ may be the same as or different from one another.

In the case of a related art (e.g., generally-utilized) photoresist composition, the etch resistance may be insufficient and the pattern may collapse at a high aspect ratio.

Meanwhile, the semiconductor photoresist composition according to an embodiment desirably includes the aforementioned organotin compound and a solvent.

The solvent included in the semiconductor photoresist composition according to an embodiment may be an organic solvent, for example, one or more aromatic compounds (e.g., xylene, toluene), alcohols (e.g., 4-methyl-2-pentenol, 4-methyl-2-propanol, 1-butanol, methanol, isopropyl alcohol, and/or 1-propanol), ethers (e.g., anisole, and/or tetrahydrofuran), esters (n-butyl acetate, propylene glycol monomethyl ether acetate, ethyl acetate, and/or ethyl lactate), ketones (e.g., methyl ethyl ketone, and/or heptanone), a mixture thereof, and/or the like, but the present disclosure is not limited thereto.

The semiconductor photoresist composition according to an embodiment may further include an additive in some embodiments. Examples of the additive may include a surfactant, a crosslinking agent, a leveling agent, or a combination thereof.

The surfactant may be, for example, an alkylbenzenesulfonic acid salt, an alkylpyridinium salt, polyethylene glycol, a quaternary ammonium salt, or a combination thereof, but the present disclosure is not limited thereto.

The crosslinking agent may be, for example, a melamine-based crosslinking agent, a substituted urea-based crosslinking agent, an acryl-based crosslinking agent, an epoxy-based crosslinking agent, and/or a polymer-based crosslinking agent, but the present disclosure is not limited thereto. The crosslinking agent may have at least two crosslinking forming substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trimethylpropane triglycidyl ether, 1,3-bis(glycidoxypropyl)tetramethyldisiloxane, methoxymethylated urea, butoxymethylated urea, methoxymethylated thiourea, and/or the like.

The leveling agent may be utilized for improving coating flatness during printing and may be a commercially available suitable leveling agent.

An amount of the additives utilized may be controlled depending on the desired properties.

In addition, the semiconductor photoresist composition may further include a silane coupling agent as an adherence enhancer in order to improve a close-contacting (e.g., adhesion) force with the substrate (e.g., in order to improve adherence of the semiconductor photoresist composition to the substrate). The silane coupling agent may be, for example, a silane compound including a carbon-carbon unsaturated bond such as vinyltrimethoxysilane, vinyltriethoxysilane, vinyl trichlorosilane, vinyltris(β-methoxyethoxy)silane; 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane; trimethoxy[3-(phenylamino)propyl]silane, and/or the like, but the present disclosure is not limited thereto.

The semiconductor photoresist composition may be formed into a pattern having a high aspect ratio without the issue of collapsing. Accordingly, in order to form a fine pattern having a width of, for example, about 5 nm to about 100 nm, about 5 nm to about 80 nm, about 5 nm to about 70 nm, about 5 nm to about 50 nm, about 5 nm to about 40 nm, about 5 nm to about 30 nm, or about 5 nm to about 20 nm, the semiconductor photoresist composition may be utilized for a photoresist process utilizing light in a wavelength ranging from about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to an embodiment may be utilized to realize extreme ultraviolet lithography utilizing an EUV light source with a wavelength of about 13.5 nm.

According to another embodiment, a method for preparing the aforementioned semiconductor photoresist composition may be provided.

The semiconductor photoresist composition according to an embodiment is prepared by reacting the organotin compound represented by Chemical Formula 2 and the organic compound represented by Chemical Formula 3 in an organic solvent to prepare the organotin compound represented by Chemical Formula 1, and by mixing the organotin compound represented by Chemical Formula 1 with a solvent.

The organotin compound represented by Chemical Formula 2 and the organic compound represented by Chemical Formula 3 are as follows, and the organotin compound represented by Chemical Formula 1 is the same as described above.

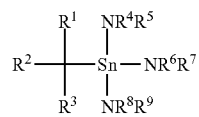

Chemical Formula 2

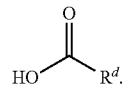

Chemical Formula 3

In Chemical Formula 2 and Chemical Formula 3, $R^1$ to $R^3$ are each independently a substituted or unsubstituted C1 to C20 alkyl group, $R^4$ to $R^9$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group; or combinations thereof, and $R^d$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group; or combinations thereof.

After dissolving the organotin compound represented by Chemical Formula 2 in an organic solvent, the organic compound represented by Chemical Formula 3 may be added dropwise thereto at about −78° C. to about 60° C., and then reacted for about 2 hours to about 24 hours to prepare the organotin compound represented by Chemical Formula 1.

For example, the reaction temperature may be about −50° C. to about 30° C., or about −20° C. to about 0° C.

For example, the reaction time may be about 4 hours to about 16 hours, or about 4 hours to about 8 hours.

$R^1$ to $R^3$ in Chemical Formulas 1 and 2 may each independently be a substituted or unsubstituted C1 to C10 alkyl group.

For example, $R^1$ to $R^3$ in Chemical Formulas 1 and 2 may each independently be (e.g., at least one) selected from a methyl group, an ethyl group, an n-propyl group, an iso-propyl group, an n-butyl group, an iso-butyl group, a sec-butyl group, and a t-butyl group.

For example, $R^1$ to $R^3$ in Chemical Formula 1 may be the same as or different from one another.

For example, $R^1$ to $R^3$ in Chemical Formula 2 may be the same as or different from one another.

$R^1$ to $R^3$ of Chemical Formula 1 may be derived from $R^1$ to $R^3$ of Chemical Formula 2, respectively.

In Chemical Formula 2, $R^4$ to $R^9$ may each independently be selected from a substituted or unsubstituted C1 to C10 alkyl group, a substituted or unsubstituted C2 to C8 alkenyl group, and a substituted or unsubstituted C2 to C8 alkynyl group.

For example, $R^4$ to $R^9$ in Chemical Formula 2 may each independently be a substituted or unsubstituted C1 to C10 alkyl group.

For example, $R^4$ to $R^9$ in Chemical Formula 2 may each independently be (e.g., at least one) selected from a methyl group, an ethyl group, an n-propyl group, an iso-propyl group, an n-butyl group, an iso-butyl group, a sec-butyl group, and a t-butyl group.

For example, $R^4$ to $R^9$ in Chemical Formula 2 may be the same as or different from one another.

$R^d$ of Chemical Formula 3 may be (e.g., at least one) selected from hydrogen, a substituted or unsubstituted C1 to C10 alkyl group, a substituted or unsubstituted C2 to C8 alkenyl group, and a substituted or unsubstituted C2 to C8 alkynyl group.

For example, $R^d$ of Chemical Formula 3 may be (e.g., at least one) selected from hydrogen, a methyl group, an ethyl group, an n-propyl group, an iso-propyl group, an n-butyl group, an iso-butyl group, a sec-butyl group, and a t-butyl group.

For example, $R^d$ of Chemical Formula 3 may be (e.g., at least one) selected from a methyl group, an ethyl group, an n-propyl group, an iso-propyl group, an n-butyl group, an iso-butyl group, a sec-butyl group, and a t-butyl group.

For example, $R^a$, $R^b$, and $R^c$ in Chemical Formula 1 may be the same as or different from one another.

For example, $R^a$, $R^b$, and $R^c$ in Chemical Formula 1 may all be the same.

For example, each of $R^a$, $R^b$, and $R^c$ of Chemical Formula 1 may be derived from $R^d$ of Chemical Formula 3.

For example, the organic compound represented by Chemical Formula 3 may be (e.g., at least one) selected from acetic acid, propionic acid, butyric acid, isobutyric acid, and combinations thereof, but the present disclosure is not limited thereto.

The method for preparing the aforementioned semiconductor photoresist composition may further include mixing with an additive selected from a surfactant, a crosslinking agent, a leveling agent, and combinations thereof.

According to another embodiment, a method of forming patterns utilizing the aforementioned semiconductor photoresist composition is provided. For example, the manufactured pattern may be a photoresist pattern. In some embodiments, the manufactured pattern may be a negative photoresist pattern.

The method of forming patterns according to an embodiment includes forming an etching-objective layer on a substrate, coating the semiconductor photoresist composition on the etching-objective layer to form a photoresist layer, patterning the photoresist layer to form a photoresist pattern, and etching the etching-objective layer utilizing the photoresist pattern as an etching mask.

Hereinafter, a method of forming patterns utilizing the semiconductor photoresist composition is described referring to FIGS. 1 to 5. FIGS. 1 to 5 are cross-sectional views for explaining a method of forming patterns utilizing the semiconductor photoresist composition according to an embodiment.

Referring to FIG. 1, an object for etching is prepared. The object for etching may be a thin film 102 formed on a semiconductor substrate 100. Hereinafter, the object for etching is limited to the thin film 102. A whole surface of the thin film 102 is washed to remove impurities and/or the like remaining thereon. The thin film 102 may be, for example, a silicon nitride layer, a polysilicon layer, and/or a silicon oxide layer.

Subsequently, the resist underlayer composition for forming a resist underlayer 104 is spin-coated on the surface of the washed thin film 102. However, the present disclosure is not limited thereto, and various suitable coating methods, for example, spray coating, dip coating, knife edge coating, printing method (for example inkjet printing and/or screen printing), and/or the like may be utilized.

In some embodiments, the coating process of the resist underlayer may be omitted, and hereinafter, a process including a coating of the resist underlayer is described.

Then, the coated composition is dried and baked to form a resist underlayer 104 on the thin film 102. The baking may be performed at about 100° C. to about 500° C., for example, about 100° C. to about 300° C.

The resist underlayer 104 is formed between the substrate 100 and a photoresist layer 106 and thus may prevent or reduce non-uniformity, and may improve pattern-forming capability of a photoresist line width when a ray reflected from the interface (e.g., between the substrate 100 and the photoresist layer 106 or a hardmask between layers) is scattered into an unintended photoresist region.

Figure 2:
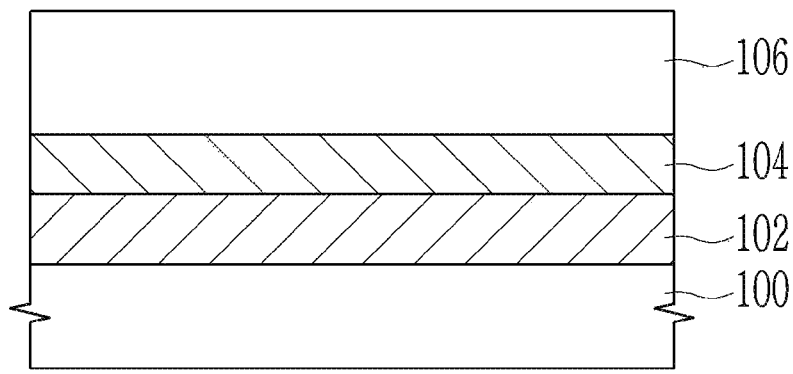

Referring to FIG. 2, the photoresist layer 106 is formed by coating the semiconductor photoresist composition on the resist underlayer 104. The photoresist layer 106 is obtained by coating the aforementioned semiconductor photoresist composition on the thin film 102 formed on the substrate 100 and then, curing it through a heat treatment.

For example, the formation of a pattern by utilizing the semiconductor photoresist composition may include coating the semiconductor photoresist composition on the substrate 100 having the thin film 102 through spin coating, slit coating, inkjet printing, and/or the like and then, drying it to form the photoresist layer 106.

The semiconductor photoresist composition has already been illustrated in detail and will not be illustrated again.

Subsequently, the substrate 100 having the photoresist layer 106 thereon is subjected to a first baking process. The first baking process may be performed at about 80° C. to about 120° C.

Figure 3:
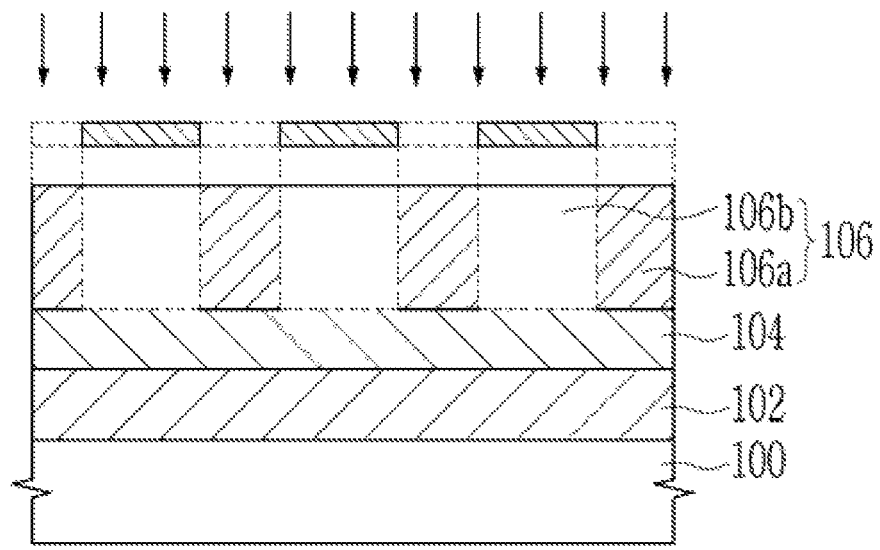

Referring to FIG. 3, the photoresist layer 106 may be selectively exposed.

For example, the exposure may utilize an activation radiation with light having a high energy wavelength such as EUV (extreme ultraviolet; a wavelength of 13.5 nm), an E-Beam (an electron beam), and/or the like as well as a short wavelength such as an i-line (a wavelength of 365 nm), a KrF excimer laser (a wavelength of 248 nm), an ArF excimer laser (a wavelength of 193 nm), and/or the like.

For example, light for the exposure according to an embodiment may have a short wavelength ranging from about 5 nm to about 150 nm and a high energy wavelength, for example, EUV (extreme ultraviolet; a wavelength of about 13.5 nm), an E-Beam (an electron beam), and/or the like.

In the forming of the photoresist pattern, a negative pattern may be formed.

The exposed region 106a of the photoresist layer 106 has a different solubility from the non-exposed region 106b of the photoresist layer 106 by forming a polymer through a crosslinking (e.g., curing) reaction (such as condensation between organometallic compounds).

Subsequently, the substrate 100 is subjected to a second baking process. The second baking process may be performed at a temperature of about 90° C. to about 200° C. The exposed region 106a of the photoresist layer 106 becomes easily indissoluble regarding a developing solution due to the second baking process. That is, through the second baking process, the exposed region 106a of the photoresist layer 106 becomes insoluble in a developing solution.

Figure 4:
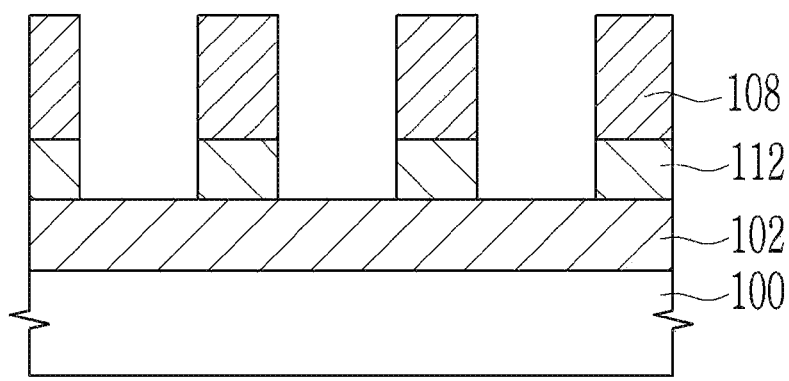

In FIG. 4, the non-exposed region 106b of the photoresist layer is dissolved and removed utilizing the developing solution to form a photoresist pattern 108. For example, the non-exposed region 106b of the photoresist layer is dissolved and removed by utilizing an organic solvent (such as 2-heptanone and/or the like) to complete the photoresist pattern 108 corresponding to the negative tone image.

As described above, the developing solution utilized in the method of forming patterns according to an embodiment may be an organic solvent. The organic solvent utilized in the method of forming patterns according to an embodiment may be, for example, one or more ketones (such as methylethylketone, acetone, cyclohexanone, 2-heptanone, and/or the like), alcohols (such as 4-methyl-2-propanol, 1-butanol, isopropanol, 1-propanol, methanol, and/or the like), esters (such as propylene glycol monomethyl ether acetate, ethyl acetate, ethyl lactate, n-butyl acetate, butyrolactone, and/or the like), aromatic compounds (such as benzene, xylene, toluene, and/or the like), or a combination thereof.

As described above, exposure to light having a high energy such as EUV (extreme ultraViolet; a wavelength of about 13.5 nm), an E-Beam (an electron beam), and/or the like as well as light having a wavelength such as i-line (wavelength of about 365 nm), KrF excimer laser (wavelength of about 248 nm), ArF excimer laser (wavelength of about 193 nm), and/or the like may provide a photoresist pattern 108 having a width of about 5 nm to about 100 nm. For example, the photoresist pattern 108 may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm.

On the other hand, the photoresist pattern 108 may have a pitch of having a half-pitch of less than or equal to about 50 nm, for example, less than or equal to about 40 nm, less than or equal to about 30 nm, less than or equal to about 20 nm, or less than or equal to about 15 nm, and a line width roughness of less than or equal to about 10 nm, less than or equal to about 5 nm, less than or equal to about 3 nm, or less than or equal to about 2 nm.

Subsequently, the photoresist pattern 108 is utilized as an etching mask to etch the resist underlayer 104. Through this etching process, an organic layer pattern 112 is formed. The organic layer pattern 112 also may have a width corresponding to that of the photoresist pattern 108.

Figure 5:
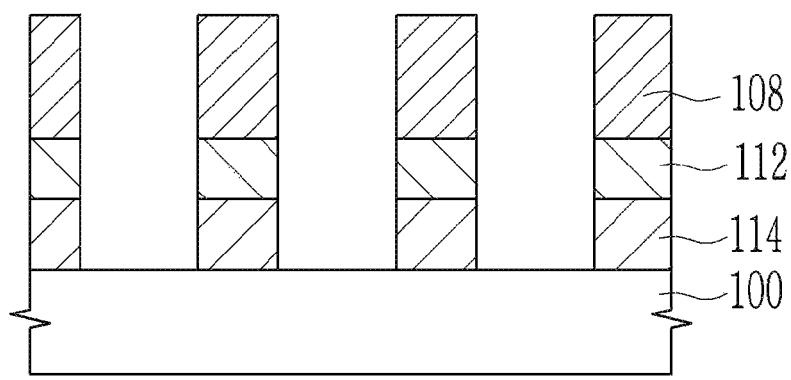

Referring to FIG. 5, the exposed thin film 102 is etched by applying the photoresist pattern 108 as an etching mask. As a result, the thin film is formed as a thin film pattern 114.

The etching of the thin film 102 may be, for example, dry etching utilizing an etching gas and the etching gas may be, for example, $CHF_3$, $CF_4$, $Cl_2$, $BCl_3$, and a mixed gas thereof.

In the exposure process, the thin film pattern 114 formed by utilizing the photoresist pattern 108 formed through the exposure process performed by utilizing an EUV light source may have a width corresponding to that of the photoresist pattern 108. For example, the thin film pattern 114 may have a width of 5 nm to 100 nm, which is equal to that of the photoresist pattern 108. For example, the thin film pattern 114 formed by utilizing the photoresist pattern 108 formed through the exposure process performed by utilizing an EUV light source may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm, and in some embodiments, may have a width of less than or equal to 20 nm, similar to (e.g., like) that of the photoresist pattern 108.

Hereinafter, the present disclosure will be described in more detail through examples of the preparation of the aforementioned semiconductor photoresist composition. However, the present disclosure is technically not restricted by the following examples.

EXAMPLES

Synthesis Example 1: Synthesis of Organotin Compound 1

An organotin compound represented by Chemical Formula 2-1 (10 g, 26.4 mmol) was dissolved in 30 ml of anhydrous toluene, and then 4.8 g of acetic acid was slowly added dropwise thereto at 0° C., followed by stirring for 6 hours.

Then, after raising the temperature to room temperature, toluene was removed by vacuum distillation, and the remaining filtrate was fractionally distilled to obtain Organotin Compound 1 represented by Chemical Formula 1-1.

Chemical Formula 2-1

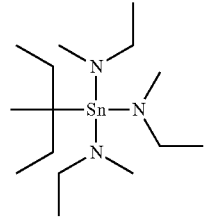

-continued

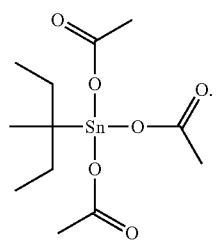

Chemical Formula 1-1

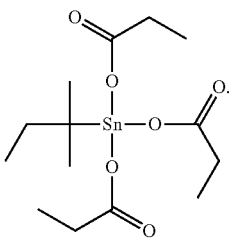

Chemical Formula 1-3

Synthesis Example 2: Synthesis of Organotin Compound 2

A compound represented by Chemical Formula 2-2 (10 g, 31.0 mmol) was dissolved in 30 ml of anhydrous toluene, and then 8.3 g of isobutyric acid was slowly added dropwise thereto at 0° C., followed by stirring for 6 hours.

Then, after raising the temperature to room temperature, toluene was removed by vacuum distillation, and the remaining filtrate was fractionally distilled to obtain Organotin Compound 2 represented by Chemical Formula 1-2.

Synthesis Example 4: Synthesis of Organotin Compound 4

An organotin compound represented by Chemical Formula 2-3 (10 g, 25.5 mmol) was dissolved in 30 ml of anhydrous toluene, and then 6.0 g of propionic acid was slowly added dropwise thereto at 0° C., followed by stirring for 6 hours.

Then, after raising the temperature to room temperature, toluene was removed by vacuum distillation, and the remaining filtrate was fractionally distilled to obtain Organotin Compound 4 represented by Chemical Formula 1-4.

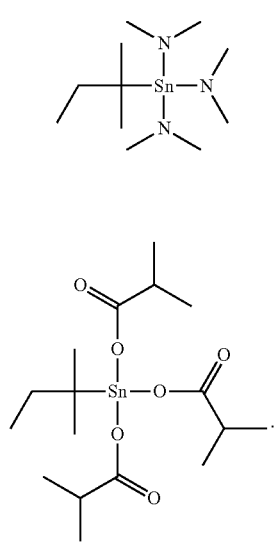

Chemical Formula 2-2

Chemical Formula 1-2

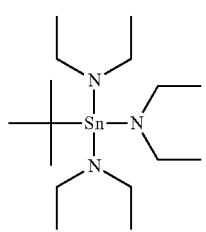

Chemical Formula 2-3

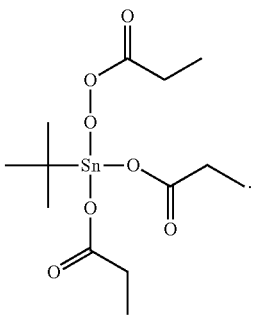

Chemical Formula 1-4

Synthesis Example 3: Synthesis of Organotin Compound 3

The organotin compound represented by Chemical Formula 2-2 (10 g, 31.0 mmol) was dissolved in 30 ml of anhydrous toluene, and then 7.0 g of propionic acid was slowly added dropwise thereto at 0° C., followed by stirring for 6 hours.

Then, after raising the temperature to room temperature, toluene was removed by vacuum distillation, and the remaining filtrate was fractionally distilled to obtain Organotin Compound 3 represented by Chemical Formula 1-3.

Synthesis Example 5: Synthesis of Organotin Compound 5

The organotin compound represented by Chemical Formula 2-3 (10 g, 25.5 mmol) was dissolved in 30 ml of anhydrous toluene, and then 6.9 g of isobutyric acid was slowly added dropwise thereto at 0° C., followed by stirring for 6 hours.

Then, after raising the temperature to room temperature, toluene was removed by vacuum distillation, and the remaining filtrate was fractionally distilled to obtain Organotin Compound 5 represented by Chemical Formula 1-5.

Chemical Formula 1-5

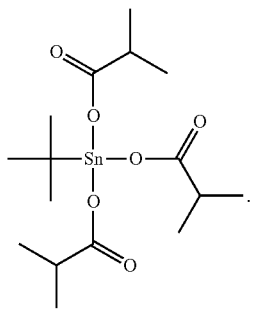

Comparative Synthesis Example 1: Synthesis of Organotin Compound A 25 ml of acetic acid was slowly added dropwise to the organotin compound (10.0 g, 25.6 mmol) represented by Chemical Formula A-1 at room temperature, and then heated under reflux at 110° C. for 24 hours.

Then, after the temperature was lowered to room temperature, acetic acid was vacuum distilled to obtain Organotin Compound A represented by Chemical Formula a.

Chemical Formula A-1

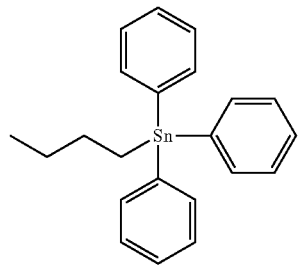

Chemical Formula a

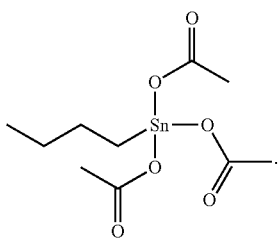

Comparative Synthesis Example 2: Synthesis of Organotin Compound B 25 ml of propionic acid was slowly added dropwise to an organotin compound (10.0 g, 24.6 mmol) represented by Chemical Formula B-1 at room temperature, and then heated under reflux at 110° C. for 24 hours.

Then, after the temperature was lowered to room temperature, propionic acid was vacuum distilled to obtain Organotin Compound B represented by Chemical Formula b.

Chemical Formula B-1

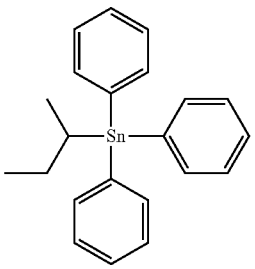

Chemical Formula b

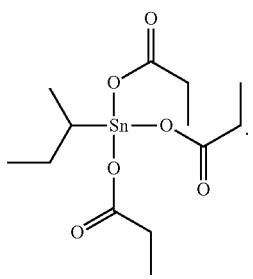

Examples 1 to 5 and Comparative Examples 1 to 2

The Organotin Compounds 1 to 5 obtained in Synthesis Examples 1 to 5, and Comparative Synthesis Examples 1 and 2, and Organotin Compounds A and B were each dissolved in PGMEA (propylene glycol methyl ether acetate) at a concentration of 3.0 wt %, and then filtered with a 0.1 μm PTFE syringe filter to prepare respective photoresist compositions of Examples 1 to 5 and Comparative Examples 1 and 2. A circular silicon wafer having a diameter of 4 inches with a native-oxide surface was utilized as a substrate for thin film deposition. The resist thin film was treated for 10 minutes in a UV ozone cleaning system before deposition, and each photoresist composition was spin-coated on a respective substrate at 2000 rpm for 30 seconds, and baked at 120° C. for 120 seconds. The thickness of each of the films after coating and firing was measured through ellipsometry, and the result was about 20 nm.

Evaluation 1: Evaluation of Sensitivity and Line Edge Roughness (LER)

Each of the photoresist compositions according to Examples 1 to 5 and Comparative Examples 1 and 2 was coated on a circular silicon wafer to produce a film, in the above coating method. The formed film was exposed to extreme ultraviolet radiation (E-beam) at an acceleration voltage of 100 kV to form 40 nm half-pitch nanowire patterns. The exposed films were each exposed to 160° C. for 60 seconds and dipped in a Petri dish containing 2-heptanone for 30 seconds and then, washed with the same solvent for 10 seconds. Finally, the washed films were baked at 150° C. for 180 seconds, and the obtained patterns were each imaged utilizing FE-SEM (field emission scanning electron microscopy). The formed pattern lines, which were confirmed through the FE-SEM images, were measured with respect to a critical dimension (CD) size and line edge roughness (LER), and then, sensitivity and line edge roughness of the films were evaluated according to the following criteria and the results are shown in Table 1.

※ Evaluation Criteria
(1) Sensitivity

The CD sizes measured at 1000 uC/cm² of energy were evaluated according to the following criteria, and the results are shown in Table 1.

⊚: greater than or equal to 40 nm
○: greater than or equal to 35 nm and less than 40 nm
Δ: less than 35 nm
X: Pattern was not confirmed.

(2) Line Edge Roughness (LER)
○: less than or equal to 5 nm
Δ: greater than 5 nm and less than or equal to 7 nm
X: greater than 7 nm Evaluation 2: Evaluation of Storage Stability On the other hand, the semiconductor photoresist compositions according to Examples 1 to 5 and Comparative Examples 1 and 2 were each evaluated with respect to storage stability, and the results are shown in Table 1.

Storage Stability

The photoresist compositions according to Examples 1 to 5 and Comparative Examples 1 and 2 were allowed to stand for a set or predetermined period at room temperature (20±5° C.) and then, examined with naked eyes with respect to a degree of precipitation and evaluated into 2 levels according to the following storability criteria.

※ Evaluation Criteria
○: Can be stored for more than or equal to 6 months
Δ: Can be stored for more than or equal to 3 months and less than 6 months
X: Can be stored for less than 3 months

TABLE 1

|  | Sensitivity | LER (nm) | Storage stability |
|---|---|---|---|
| Example 1 | ⊚ | ○ | ○ |
| Example 2 | ⊚ | ○ | ○ |
| Example 3 | ⊚ | ○ | ○ |
| Example 4 | ⊚ | ○ | ○ |
| Example 5 | ⊚ | ○ | ○ |
| Comparative Example 1 | Δ | X | X |
| Comparative Example 2 | Δ | X | X |

Referring to Table 1, the semiconductor photoresist compositions according to Examples 1 to 5 exhibited better (e.g., more excellent) storage stability than the semiconductor photoresist compositions according to Comparative Examples 1 and 2, and in addition, the patterns formed of the semiconductor photoresist compositions according to Examples 1 to 5 exhibited better (e.g., more excellent) sensitivity and line edge roughness (LER) than the patterns formed of the semiconductor photoresist compositions according to Comparative Examples 1 and 2.

As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items. Further, the use of "may" when describing embodiments of the present disclosure refers to "one or more embodiments of the present disclosure".

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinbefore, certain embodiments of the present disclosure have been described and illustrated, however, it is apparent to a person with ordinary skill in the art that the present disclosure is not limited to the embodiments described, and may be variously modified and transformed without departing from the spirit and scope of the present disclosure. Accordingly, the modified or transformed embodiments are within the scope of the claims of the present disclosure, and equivalents thereof.

| Description of symbols | |
|---|---|
| 100: substrate | 102: thin film |
| 104: resist underlayer | 106: photoresist layer |
| 106a: exposed region | 106b: non-exposed region |
| 108: photoresist pattern | 112: organic layer pattern |
| 114: thin film pattern | |

What is claimed is:

1. A semiconductor photoresist composition, comprising:
an organotin compound represented by Chemical Formula 1, and a solvent:

Chemical Formula 1

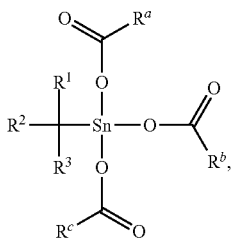

and
wherein, in Chemical Formula 1,
R$^1$ to R$^3$ are each independently a substituted or unsubstituted C1 to C20 alkyl group, and
R$^a$, R$^b$, and R$^c$ are each independently a substituted or unsubstituted C1 to C20 alkyl group, a substituted or unsubstituted C3 to C20 cycloalkyl group, a substituted of unsubstituted C2 to C20 alkenyl group, a substituted or unsubstituted C2 to C20 alkynyl group, or a substituted or unsubstituted C6 to C30 aryl group.

2. The semiconductor photoresist composition of claim 1, wherein R$^1$ to R$^3$ are each independently a methyl group, an ethyl group, an n-propyl group, an iso-propyl group, an n-butyl group, an iso-butyl group, a sec-butyl group, or a t-butyl group.

3. The semiconductor photoresist composition of claim 1, wherein R$^a$, R$^b$, and R$^c$ are each independently a methyl group, an ethyl group, an n-propyl group, an iso-propyl group, an n-butyl group, an iso-butyl group, a sec-butyl group, or a t-butyl group.

4. The semiconductor photoresist composition of claim 1, wherein the semiconductor photoresist composition further comprises an additive selected from a surfactant, a crosslinking agent, a leveling agent, and combinations thereof.

5. A method for preparing a semiconductor photoresist composition, the method comprising:
reacting an organotin compound represented by Chemical Formula 2 with an organic compound represented by Chemical Formula 3 in an organic solvent to prepare an organotin compound represented by Chemical Formula 1, and
mixing the organotin compound represented by Chemical Formula 1 with the organic solvent;

Chemical Formula 2

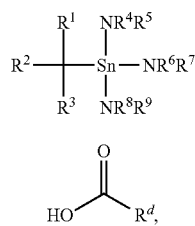

Chemical Formula 3 and
wherein, in Chemical Formula 2 and Chemical Formula 3,
R$^1$ to R$^3$ are each independently a substituted or unsubstituted C1 to C20 alkyl group,
R$^4$ to R$^9$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group, and
R$^d$ is hydrogen, a substituted or unsubstituted C1 to C20 alkyl group, a substituted or unsubstituted C3 to C20 cycloalkyl group. a substituted or unsubstituted C2 to C20 alkenyl group, a substituted or unsubstituted C2 to C20 alkynyl group, or a substituted or unsubstituted C6 to C30 aryl group;

Chemical Formula 1

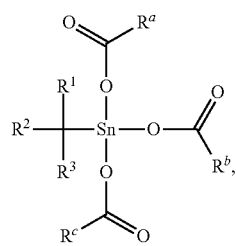

and
wherein, in Chemical Formula 1,
R$^1$ to R$^3$ are each independently a substituted or unsubstituted C1 to C20 alkyl group, and
R$^a$, R$^b$, and R$^c$ each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group.

6. The method of claim 5, wherein the reacting of the organotin compound represented by Chemical Formula 2 with the organic compound represented by Chemical Formula 3 in the organic solvent to prepare the organotin compound represented by Chemical Formula 1 comprises:
dissolving the organotin compound represented by Chemical Formula 2 in the organic solvent,
adding the organic compound represented by Chemical Formula 3 thereto dropwise at about −78° C. to about 60° C., and
reacting for about 2 hours to about 24 hours to prepare the organotin compound represented by Chemical Formula 1.

7. The method of claim 5, wherein R$^1$ to R$^3$ in Chemical Formula 1 are each independently a methyl group, an ethyl group, an n-propyl group, an iso-propyl group, an n-butyl group, an iso-butyl group, a sec-butyl group, or a t-butyl group.

8. The method of claim 5, wherein R$^4$ to R$^9$ are each independently a substituted or unsubstituted C1 to C10 alkyl group, a substituted or unsubstituted C2 to C8 alkenyl group, or a substituted or unsubstituted C2 to C8 alkynyl group.

9. The method of claim 5, wherein R$^d$ is hydrogen, a methyl group, an ethyl group, an n-propyl group, an iso-propyl group, an n-butyl group, an iso-butyl group, a sec-butyl group, or a t-butyl group.

10. The method of claim 5, further comprising adding an additive selected from a surfactant, a crosslinking agent, a leveling agent, and combinations thereof.

11. A method of forming a pattern, the method comprising:
forming an etching-objective layer on a substrate;
coating the semiconductor photoresist composition of claim 1 on the etching-objective layer to form a photoresist layer;

patterning the photoresist layer to form a photoresist pattern; and etching the etching-objective layer utilizing the photoresist pattern as an etching mask.

12. The method of claim 11, wherein the patterning of the photoresist layer to form the photoresist pattern comprises exposing the photoresist layer to light with a wavelength of about 5 nm to about 150 nm.

13. The method of claim 11, further comprising providing a resist underlayer between the substrate and the photoresist layer.

14. The method of claim 11, wherein the photoresist pattern has a width of about 5 nm to about 100 nm.

15. A method of forming a pattern, the method comprising:

forming an etching-objective layer on a substrate;

coating the semiconductor photoresist composition prepared by the method of claim 5 on the etching-objective layer to form a photoresist layer;

patterning the photoresist layer to form a photoresist pattern; and etching the etching-objective layer utilizing the photoresist pattern as an etching mask.

16. The method of claim 15, wherein the patterning of the photoresist layer to form the photoresist pattern comprises exposing the photoresist layer to light with a wavelength of about 5 nm to about 150 nm.

17. The method of claim 15, further comprising providing a resist underlayer between the substrate and the photoresist layer.

18. The method of claim 15, wherein the photoresist pattern has a width of about 5 nm to about 100 nm.

* * * * *

UNITED STATES PATENT AND TRADEMARK OFFICE
CERTIFICATE OF CORRECTION

PATENT NO. : 12,242,189 B2
APPLICATION NO. : 17/454447
DATED : March 4, 2025
INVENTOR(S) : Kyungsoo Moon Page 1 of 1

It is certified that error appears in the above-identified patent and that said Letters Patent is hereby corrected as shown below:

In the Claims

In Column 19, Line 21, in Claim 1, delete "of" and insert -- or --.

In Column 19, Line 46, in Claim 5, delete "solvent;" and insert -- solvent: --.

In Column 20, Line 5, in Claim 5, delete "group." and insert -- group, --.

In Column 20, Line 27, in Claim 5, after "R$^c$" insert -- are --.

Signed and Sealed this
Third Day of June, 2025

Coke Morgan Stewart
*Acting Director of the United States Patent and Trademark Office*